US009129896B2

(12) United States Patent
Hu et al.

(10) Patent No.: US 9,129,896 B2
(45) Date of Patent: Sep. 8, 2015

(54) ARRAYS COMPRISING VERTICALLY-ORIENTED TRANSISTORS, INTEGRATED CIRCUITRY COMPRISING A CONDUCTIVE LINE BURIED IN SILICON-COMPRISING SEMICONDUCTOR MATERIAL, METHODS OF FORMING A PLURALITY OF CONDUCTIVE LINES BURIED IN SILICON-COMPRISING SEMICONDUCTOR MATERIAL, AND METHODS OF FORMING AN ARRAY COMPRISING VERTICALLY-ORIENTED TRANSISTORS

(75) Inventors: Yongjun Jeff Hu, Boise, ID (US); Allen McTeer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/591,065

(22) Filed: Aug. 21, 2012

(65) Prior Publication Data
US 2014/0054677 A1    Feb. 27, 2014

(51) Int. Cl.
H01L 29/66    (2006.01)
H01L 21/265   (2006.01)
H01L 29/78    (2006.01)
H01L 27/108   (2006.01)

(52) U.S. Cl.
CPC ...... *H01L 21/26506* (2013.01); *H01L 21/2656* (2013.01); *H01L 21/26513* (2013.01); *H01L 29/7827* (2013.01); *H01L 27/10873* (2013.01); *H01L 27/10882* (2013.01)

(58) Field of Classification Search
None
See application file for complete search history.

(56) References Cited

U.S. PATENT DOCUMENTS

| 3,562,022 | A | 2/1971 | Shifrin |
| 3,865,624 | A | 2/1975 | Wilde |
| 4,673,962 | A | 6/1987 | Chatterjee et al. |
| 4,764,394 | A | 8/1988 | Conrad |
| 4,920,390 | A | 4/1990 | Fuse et al. |
| 5,374,456 | A | 12/1994 | Matossian et al. |
| 5,508,212 | A | 4/1996 | Wang et al. |
| 5,627,390 | A | 5/1997 | Maeda et al. |

(Continued)

FOREIGN PATENT DOCUMENTS

| KR | 10-2004-0055142 | 6/2004 |
| WO | PCT/US2013/051662 | 11/2013 |
| WO | PCT/US2013/051662 | 3/2015 |

OTHER PUBLICATIONS

Dopant Diffusion in C-Doped and Si and SiGe: Physical Model and Experimental Verification; Rucker et al.; Institute for Semiconductor Physics; 1999; 4 pp.

(Continued)

*Primary Examiner* — Benjamin Sandvik
(74) *Attorney, Agent, or Firm* — Wells St. John, P.S.

(57) ABSTRACT

An array includes vertically-oriented transistors, rows of access lines, and columns of data/sense lines. Individual of the rows include an access line interconnecting transistors in that row. Individual of the columns include a data/sense line interconnecting transistors in that column. The data/sense line has silicon-comprising semiconductor material between the transistors in that column that is conductively-doped n-type with at least one of As and Sb. The conductively-doped semiconductor material of the data/sense line includes a conductivity-neutral dopant between the transistors in that column. Methods are disclosed.

30 Claims, 17 Drawing Sheets

(56) References Cited

U.S. PATENT DOCUMENTS

| | | | |
|---|---|---|---|
| 5,672,541 A | 9/1997 | Booske et al. | |
| 5,828,094 A | 10/1998 | Lee | |
| 5,897,363 A | 4/1999 | Gonzalez et al. | |
| 6,137,713 A | 10/2000 | Kuroda et al. | |
| 6,221,724 B1 | 4/2001 | Yu et al. | |
| 6,225,151 B1 * | 5/2001 | Gardner et al. | 438/162 |
| 6,329,686 B1 | 12/2001 | Lowrey et al. | |
| 6,417,040 B2 | 7/2002 | Noble | |
| 6,492,245 B1 | 12/2002 | Liu et al. | |
| 6,504,201 B1 * | 1/2003 | Noble et al. | 257/302 |
| 6,563,162 B2 | 5/2003 | Han et al. | |
| 6,582,998 B2 | 6/2003 | Nitta | |
| 6,593,612 B2 | 7/2003 | Gruening et al. | |
| 6,600,191 B2 | 7/2003 | Lowrey et al. | |
| 6,639,846 B2 | 10/2003 | Nikutta | |
| 6,689,660 B1 | 2/2004 | Noble et al. | |
| 6,716,727 B2 | 4/2004 | Walther | |
| 6,977,417 B2 | 12/2005 | Momiyama et al. | |
| 6,992,349 B2 | 1/2006 | Lee et al. | |
| 7,015,091 B1 | 3/2006 | Wu | |
| 7,052,941 B2 | 5/2006 | Lee | |
| 7,074,656 B2 | 7/2006 | Yeo et al. | |
| 7,099,174 B2 | 8/2006 | Thompson et al. | |
| 7,129,538 B2 | 10/2006 | Lee et al. | |
| 7,166,479 B2 | 1/2007 | Zhu et al. | |
| 7,179,703 B2 | 2/2007 | Gonzalez et al. | |
| 7,365,384 B2 | 4/2008 | Tran et al. | |
| 7,456,068 B2 | 11/2008 | Kavalieros et al. | |
| 7,491,641 B2 | 2/2009 | Southwick et al. | |
| 7,501,676 B2 | 3/2009 | Doyle | |
| 7,518,182 B2 | 4/2009 | Abbott et al. | |
| 7,592,212 B2 | 9/2009 | Qin et al. | |
| 7,713,823 B2 | 5/2010 | Sung et al. | |
| 7,736,969 B2 | 6/2010 | Abbott et al. | |
| 7,737,010 B2 | 6/2010 | Qin et al. | |
| 7,768,073 B2 | 8/2010 | Wells | |
| 7,939,409 B2 | 5/2011 | Figura et al. | |
| 7,948,064 B2 | 5/2011 | Barth et al. | |
| 7,956,402 B2 | 6/2011 | Chen et al. | |
| 8,008,158 B2 | 8/2011 | Chang et al. | |
| 8,202,781 B2 * | 6/2012 | Kim | 438/270 |
| 8,450,175 B2 * | 5/2013 | Guha et al. | 438/259 |
| 2002/0110039 A1 | 8/2002 | Forbes et al. | |
| 2003/0096490 A1 | 5/2003 | Borland et al. | |
| 2003/0107911 A1 | 6/2003 | Nishihara et al. | |
| 2003/0186519 A1 | 10/2003 | Downey et al. | |
| 2004/0132232 A1 | 7/2004 | Noble | |
| 2004/0195594 A1 | 10/2004 | Tran et al. | |
| 2005/0017281 A1 | 1/2005 | Lowrey | |
| 2005/0079721 A1 | 4/2005 | Buerger, Jr. et al. | |
| 2005/0260838 A1 | 11/2005 | Downey et al. | |
| 2006/0017088 A1 | 1/2006 | Abbott et al. | |
| 2006/0059449 A1 | 3/2006 | Yang et al. | |
| 2006/0081884 A1 | 4/2006 | Abbott et al. | |
| 2006/0249770 A1 | 11/2006 | Huo et al. | |
| 2007/0087574 A1 | 4/2007 | Gupta et al. | |
| 2007/0171742 A1 | 7/2007 | Yi | |
| 2007/0243680 A1 | 10/2007 | Harai et al. | |
| 2007/0246783 A1 | 10/2007 | Moon et al. | |
| 2007/0295995 A1 | 12/2007 | Yun et al. | |
| 2008/0142931 A1 | 6/2008 | Sasaki et al. | |
| 2008/0217655 A1 | 9/2008 | Baumann et al. | |
| 2008/0268628 A1 * | 10/2008 | Kohli et al. | 438/542 |
| 2008/0277738 A1 * | 11/2008 | Ananthan | 257/390 |
| 2009/0121268 A1 | 5/2009 | Lee et al. | |
| 2009/0230466 A1 | 9/2009 | Kim | |
| 2009/0256187 A1 * | 10/2009 | Kim | 257/314 |
| 2010/0038709 A1 | 2/2010 | Wang et al. | |
| 2010/0237423 A1 | 9/2010 | Yun et al. | |
| 2011/0019486 A1 | 1/2011 | Jang et al. | |
| 2011/0215391 A1 * | 9/2011 | Takaishi | 257/306 |
| 2011/0215408 A1 | 9/2011 | Tang et al. | |
| 2011/0220994 A1 | 9/2011 | Parekh et al. | |
| 2012/0104491 A1 | 5/2012 | Heineck et al. | |
| 2012/0214285 A1 | 8/2012 | Guha et al. | |
| 2013/0168757 A1 | 7/2013 | Hong | |

OTHER PUBLICATIONS

Bernstein et al., Effects of Dopant Deposition on p+/n and n+/p Shallow Junctions formed by Plasma Immersion Ion Implantation, IEEE, 2000, 464-467.

Gras-Marti, "Recoil Implanatation Yields and Depth Profiles", Phys. Stat. Sol. (1) 76, 621-627, 1983.

Oh et al., "Characterization of $B_2H_6$ Plasma doping for converted p+ Poly-Si Gate", Ion Imiplantation Technology, 2006 American Institute of Physics, pp. 25-28.

Qin et al., "Comparative Study of Self-Sputtering Effects of Different Boron-Based Low-Energy Doping Techniques", IEEE, vol 37, No. 9, Sep. 2009, pp. 1760-1766.

* cited by examiner

ARRAYS COMPRISING VERTICALLY-ORIENTED TRANSISTORS, INTEGRATED CIRCUITRY COMPRISING A CONDUCTIVE LINE BURIED IN SILICON-COMPRISING SEMICONDUCTOR MATERIAL, METHODS OF FORMING A PLURALITY OF CONDUCTIVE LINES BURIED IN SILICON-COMPRISING SEMICONDUCTOR MATERIAL, AND METHODS OF FORMING AN ARRAY COMPRISING VERTICALLY-ORIENTED TRANSISTORS

TECHNICAL FIELD

Embodiments disclosed herein pertain to arrays comprising vertically-oriented transistors, to integrated circuitry comprising a conductive line buried in silicon-comprising semiconductor material, to methods of forming a plurality of conductive lines buried in silicon-comprising semiconductor material, and to methods of forming an array comprising vertically-oriented transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin dielectric. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Transistors other than field-effect transistors, for example bipolar transistors, may additionally or alternately be used in memory cells.

One type of volatile memory is dynamic random access memory (DRAM). Some DRAM memory cells may comprise a field effect transistor coupled with a charge-storage device, such as a capacitor. Other example memory cells may lack capacitors, and instead may use electrically floating transistor bodies. Memory which uses electrically floating transistor bodies to store data may be referred to as zero-capacitor-one-transistor (0C1T) memory, as capacitor-less memory, or as ZRAM™ (zero capacitance DRAM), and may be formed to much higher levels of integration than DRAM.

Regardless, the gates of the transistors may interconnect along rows of the memory cells and form the access lines. The digit or data/sense lines may interconnect with one of the source/drains of each transistor along columns of the memory cells. The data/sense lines may comprise conductively-doped semiconductor material that is continuous between and through one of the source/drain regions of the transistors. The data/sense lines may connect with individual sense amplifiers outside of the memory array. Access lines and data/sense lines may be used in memory arrays wherein the individual memory cells include transistors in addition to or other than field effect transistors. Regardless, it is desirable that the data/sense lines be of high conductivity. Further, it is desirable to minimize parasitic capacitance and cross-talk between immediately adjacent data/sense lines.

Transistors may be used in memory other than DRAM and in other than volatile memory. Further, transistors may be formed in arrays other than memory. Additionally, conductive lines other than data/sense lines associated with transistors may be formed to comprise continuously running conductively-doped semiconductor material.

DETAILED DESCRIPTION OF EXAMPLE EMBODIMENTS

Figure 1:
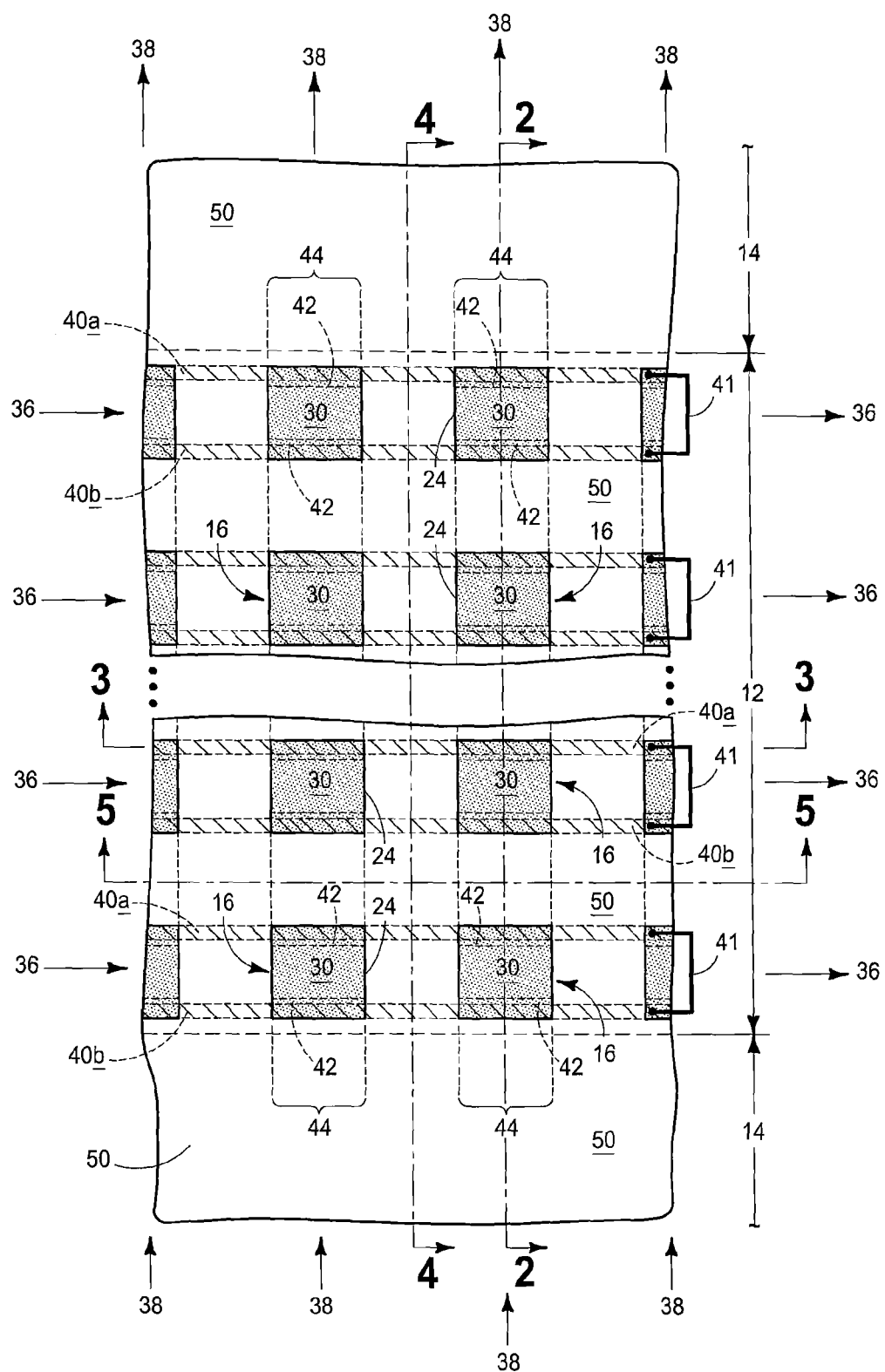
FIG. 1 is a diagrammatic, fragmented, hybrid top plan and schematic view of a substrate fragment comprising an array in accordance with an embodiment of the invention, and which comprises vertically-oriented transistors.

Structure embodiments of the invention include arrays comprising vertically-oriented transistors and integrated circuitry comprising a conductive line buried in silicon-comprising semiconductor material. Example embodiments are initially described with reference to FIGS. 1-5. Such show a substrate fragment 10, for example a semiconductor substrate, comprising an array or sub-array area 12 and circuitry area 14 peripheral to array/sub-array area 12. Array 12 includes an array of vertically-oriented transistors 16. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three-dimensional space. Further in this document, words such as "underlying", "under", "lower", "outward", "beneath", "above", and "elevationally" are relative terms corresponding to the vertical direction with respect to the structure being described. Circuitry may be fabricated outside of array 12 (e.g., in area 14) for operating vertically-oriented transistors 16. Control and/or other peripheral circuitry for operating vertically-oriented transistors 16 may or may not wholly or partially be received within array 12, with an example array as a minimum encompassing all of the vertically-oriented transistors (e.g., which may include memory cells) of a given array/sub-array. Further, multiple sub-arrays may also be fabricated and operated independently, in tandem, or otherwise relative one another. As used in this document, a "sub-array" may also be considered as an array.

In some embodiments, the array comprises memory, for example comprising a plurality of individual memory cells which include a generally vertically-oriented transistor. One example is DRAM, although other existing or yet-to-be-developed volatile and non-volatile memory is contemplated. FIGS. 1-5 by way of example show array 12 as comprising a plurality of memory cells 18 which individually include a transistor 16 and a charge storage device 15 (shown schematically in FIGS. 2 and 3). Charge storage device 15 is shown as being a capacitor, although other storage devices or techniques may be used and which may be formed within and/or above substrate fragment 10.

Figure 2:
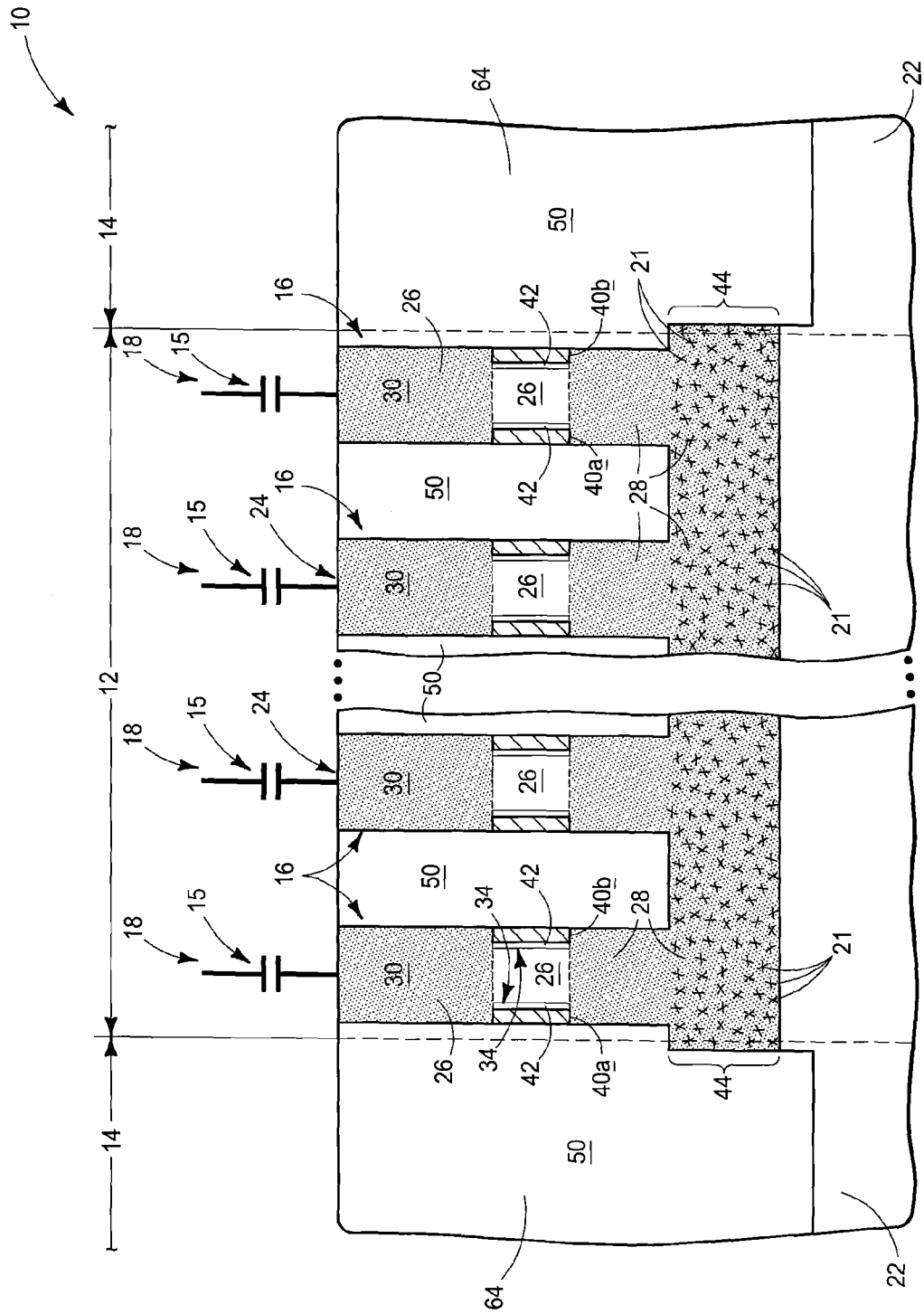
FIG. 2 is a hybrid schematic and structural cross-sectional view taken through line 2-2 in FIG. 1.
Figure 3:
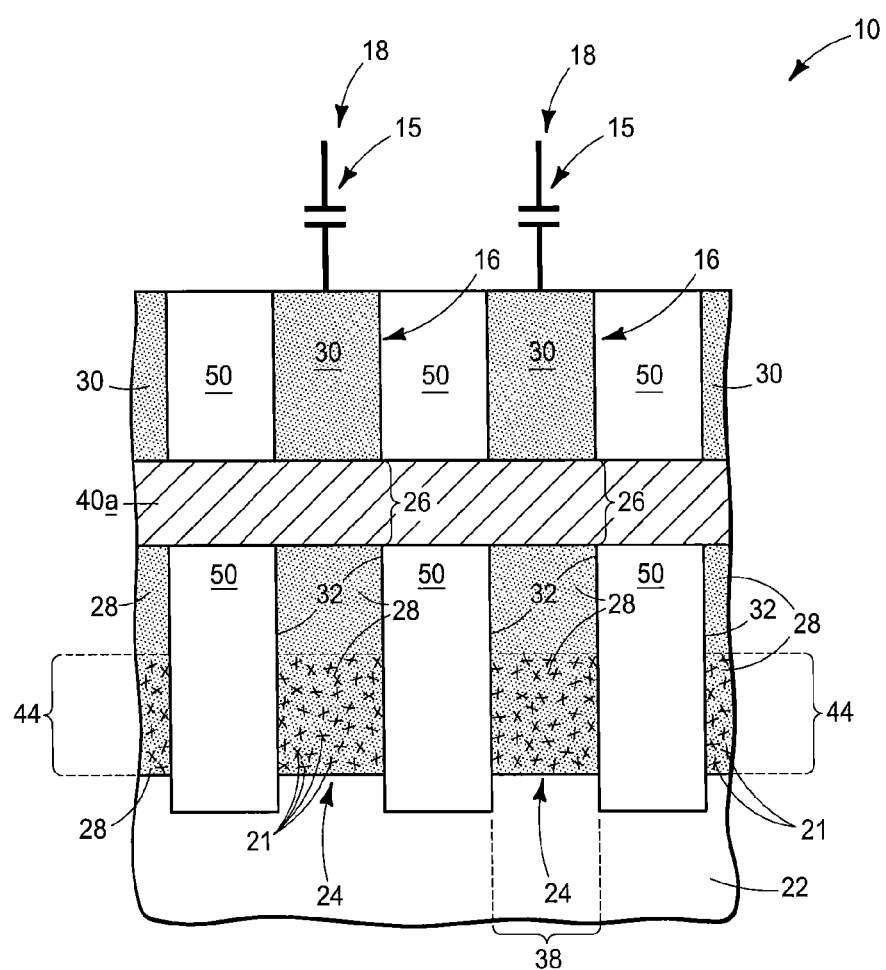
FIG. 3 is a hybrid schematic and structural cross-sectional view taken through line 3-3 in FIG. 1.

Substrate fragment 10 comprises substrate material 22 which may be homogenous or non-homogenous, and may comprise multiple different composition materials, regions, and/or layers. Example materials include semiconductor material, for example bulk monocrystalline silicon lightly background doped with a p-type conductivity-modifying impurity. Other semiconductor materials, including semiconductor-on-insulator substrates, may also be used. In some embodiments and as shown, vertically-oriented transistors 16 are field-effect transistors. FIGS. 1-3 show individual transistors 16 as including semiconductor-comprising pedestals 24 having an elevationally outer source/drain region 30, an elevationally inner source/drain region 28, and a channel region 26 received elevationally between inner source/drain region 28 and outer source/drain region 30. Each may be homogenous or non-homogenous, with suitably doped semiconductor material (e.g., monocrystalline silicon) being examples. Specifically, inner and outer source/drain regions 28, 30, respectively, may comprise highest-doped concentration portions which are suitably conductively-doped with one type of conductivity-modifying impurity, wherein channel region 26 may be doped with a lower concentration of an opposite type impurity. Each region 28 and/or 30 may include one or more of same-type lightly doped regions (e.g., LDD) and of opposite-type doped halo regions (neither of which is specifically designated nor shown). Regardless, individual charge storage devices 15 may electrically couple to respective outer source/drain regions 30. In the context of this document, devices or components are electrically coupled relative one another if electric current continuously flows from one to the other predominately by movement of subatomic positive and/or negative charges when such are sufficiently generated as opposed to predominately by movement of ions. Inner source/drain regions 28 may be considered as having opposing laterally outer sides 32 (FIG. 3). Further, channel regions 26 may be considered as having opposing laterally outer sides 34 (FIG. 2), and in one embodiment which are transversely oriented relative to sides 32 of inner source/drain regions 28.

Array 12 includes rows 36 of access lines and columns 38 of data/sense lines (FIG. 1). Use of "rows" and "columns" in this document is for convenience in distinguishing a series of access lines from a series of data/sense lines. Accordingly, "rows" and "columns" are intended to be synonymous with a series of access lines and a series of data/sense lines, respectively. The rows may be straight and/or curved and/or parallel and/or unparallel relative one another, as may be the columns. Further, the rows and columns may intersect relative one another at 90° or at one or more other angles. In the depicted example, each of the rows and columns are shown as being individually straight and angling relative one another at 90°.

Individual rows comprise an access line which interconnects transistors in that row. One access line or multiple access lines may be used which interconnect transistors in that row. Where multiple access lines are used, such lines may be electrically coupled relative one another. FIGS. 1-4 show individual rows 36 as comprising a pair of access lines 40a, 40b. In one embodiment and as shown, the access lines also form gates for individual field effect transistors, and therefore in some embodiments comprise access gate lines. One of the pair of access lines 40a, 40b is operatively laterally over one of laterally outer sides 34 of channel region 26, with the other of the pair of gate lines 40a, 40b being operatively laterally over the other of laterally outer sides 34 of channel region 26. A gate dielectric 42 is provided laterally between individual access gate lines 40a, 40b and respective channel regions 26. Access lines 40a, 40b may be homogenous or non-homogenous, may be of the same composition or of different compositions relative one another, and will comprise any suitably conductive material(s), for example any one or more of elemental metals, an alloy of elemental metals, a conductive metal compound, and conductively-doped semiconductor material(s). Access lines 40a, 40b are shown to be rectangular in cross section, although any shape may be used. Further, each need not be of the same shape relative the other. Access lines 40a, 40b and gate dielectric 42 are shown as being laterally recessed relative to laterally outermost sides of source/drain regions 28, 30. Alternately, as another example, access lines 40a, 40b and gate dielectric 42 may be received laterally outward of the sides of source/drain regions 28, 30, for example which might simplify fabrication and/or be used to impact operation of transistors 16.

Access lines 40a, 40b within individual rows 36 may be electrically coupled relative one another, for example as shown schematically via respective interconnects 41 (FIG. 1). As an alternate example, gate dielectric may be received circumferentially about the channel regions (not shown), with the access line in a single row encircling that gate dielectric and running continuously as a single access line in the individual rows (not shown).

Individual columns comprise an inner data/sense line elevationally inward of the access lines and which interconnects transistors in that column. One data/sense line or multiple data/sense lines may be used elevationally inward of the access lines for interconnecting transistors in that column. FIGS. 1-5 show individual columns 38 as comprising a data/sense line 44 elevationally inward of access lines 40a, 40b. In one embodiment and as shown, the elevationally inner source/drain regions 28 are continuously connected in individual columns 38 to comprise at least part of the data/sense line 44 in that column (FIG. 2). Data/sense lines 44 comprise silicon-comprising semiconductor material between the transistors in that column that is conductively-doped n-type with at least one of As and Sb. Ideally, source/drain regions 28 at least where connected with data/sense lines 44 are of the same composition as data/sense lines 44 and may thereby comprise a portion thereof. The As and/or Sb doping is indicated in the figures with stippling. Example total As and/or Sb n-type dopant concentration for the highest conductive portions of inner source source/drain regions 28 and data/sense lines 44 is at least $5 \times 10^{19}$ atoms/cm$^3$. Example p-type dopant concentration for channel region 26 is about $1 \times 10^{18}$ atoms/cm$^3$.

The conductively-doped silicon-comprising semiconductor material of data sense lines 44 comprises a conductivity-neutral dopant 21 at least between transistors 16 in that column, and ideally also within inner source/drain regions 28. In the context of this document, a "conductivity-neutral dopant" is conductivity-neutral to semiconductor properties in silicon and provided at a concentration that is insufficient to appreciably form a stoichiometric compound with silicon if such dopant is even capable of forming a stoichiometric compound with silicon. In one embodiment, the conductivity-neutral dopant is at a concentration of from about $1 \times 10^{19}$ atoms/cm$^3$ to about $1 \times 10^{22}$ atoms/cm$^3$ in the silicon-comprising semiconductor material of the data/sense line where such is received. In one embodiment, the conductivity-neutral dopant is continuously received along individual data/sense lines 44, and in one embodiment is so received homogenously there-along.

Example conductivity-neutral dopants include carbon and germanium. Regardless, the conductivity-neutral dopant may have no function in operation in the final circuitry construction of the vertically-oriented transistors, nor any operational impacting property associated with conductivity of data/sense lines 44. However, conductivity-neutral dopants will have required attributes in method embodiments as described below.

Data/sense lines 44 may individually include one or more additional conductive lines (not shown), for example which may be formed of material of greater conductivity than the conductively-doped silicon-comprising material of lines 44. As an example, one or more metal lines (not shown) may be formed against opposing laterally outer sides 32 of inner source/drain regions 28. Example materials for such lines include those described above for access lines 40a, 40b. Additionally, individual columns may comprise one or more outer data/sense lines (not shown) elevationally outward of the access lines and which electrically couple(s) to the inner date/sense line in that column, for example as disclosed in U.S. patent application Ser. No. 13/413,402 filed on Mar. 6, 2012 (now U.S. Patent Publication No. 2013/0235642), naming Lars P. Heineck and Jonathan T. Doebler as inventors, and entitled "Arrays Of Vertically-Oriented Transistors, Memory Arrays Including Vertically-Oriented Transistors, And Memory Cells". Such constructions may lower the overall resistance of the data/sense lines to sense amplifiers external of the array. Additionally, such constructions may lower the ratio of data/sense line-to-data/sense line capacitance to data/sense line-to-world capacitance, thus perhaps improving the final signal delivered to individual sense amplifiers.

Figure 4:
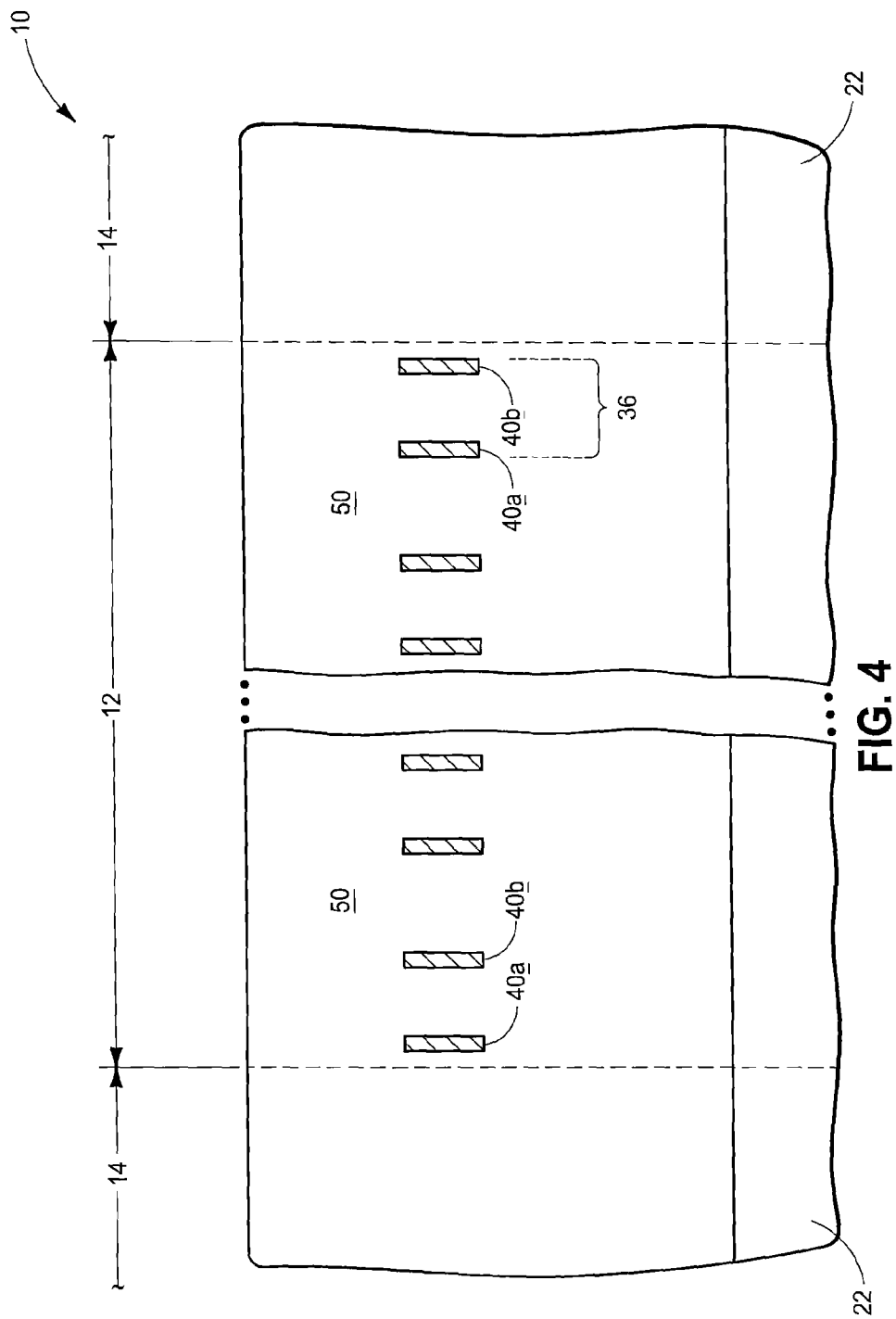
FIG. 4 is a structural cross-sectional view taken through line 4-4 in FIG. 1.
Figure 5:
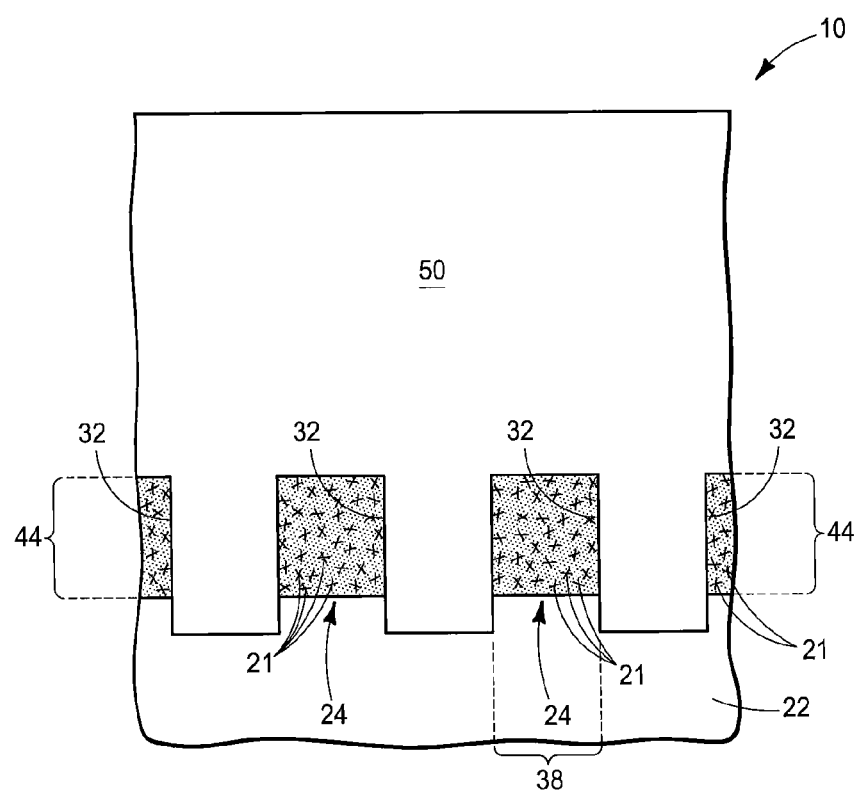
FIG. 5 is a structural cross-sectional view taken through line 5-5 in FIG. 5.

Dielectric material 50 is received about transistors 16, including access lines 40a, 40b, data/sense lines 44, and semiconductor-comprising pedestals 24. Dielectric material 50 may be homogenous or non-homogenous, with silicon nitride and boron and/or phosphorus-doped silicon dioxide being examples. Access gate lines 40a, 40b are shown with diagonal hatching for distinguishing clarity in FIG. 1, although such are received within dielectric material 50 as shown in FIGS. 2-4.

Semiconductor-comprising pedestals 24 and data/sense lines 44 are diagrammatically shown as having vertical, straight, and aligned sidewalls. However, such may not be so-provided and may for example include arcuate and/or angled portions which may or may not align.

Structures in accordance with embodiments of the invention may be fabricated using any existing or yet-to-be-developed techniques. For example, processing may occur at least in part as described in any one or more of U.S. patent application Ser. No. 12/917,346 filed on Nov. 1, 2010 (now U.S. Pat. No. 8,361,856), naming Lars P. Heineck and Jaydip Guha as inventors, and entitled "Memory Cells, Arrays Of Memory Cells, And Methods Of Forming Memory Cells"; U.S. patent application Ser. No. 13/031,829 filed on Feb. 22, 2011 (now U.S. Pat. No. 8,450,175), naming Jaydip Guha, Shyam Surthi, Suraj J. Mathew, Kamal M. Karda, and Hung-Ming Tsai as inventors, and entitled "Methods Of Forming A Vertical Transistor And At Least A Conductive Line Electrically Coupled Therewith, Methods Of Forming Memory Cells, And Methods Of Forming Arrays Of Memory Cells"; and U.S. patent application Ser. No. 13/413,402 filed on Mar. 6, 2012 (now U.S. Patent Publication No. 2013/0235642), naming Lars P. Heineck and Jonathan T. Doebler as inventors, and entitled "Arrays Of Vertically-Oriented Transistors, Memory Arrays Including Vertically-Oriented Transistors, And Memory Cells".

Further and regardless, embodiments of the invention include methods of forming an array comprising vertically-oriented transistors. Additionally, embodiments of the invention include methods of forming a plurality of conductive lines buried in a silicon-comprising semiconductor material independent or regardless of forming an array comprising vertically-oriented transistors. Further, aspects of the structure embodiments are not limited by the method embodiments, or vice versa.

Figure 6:
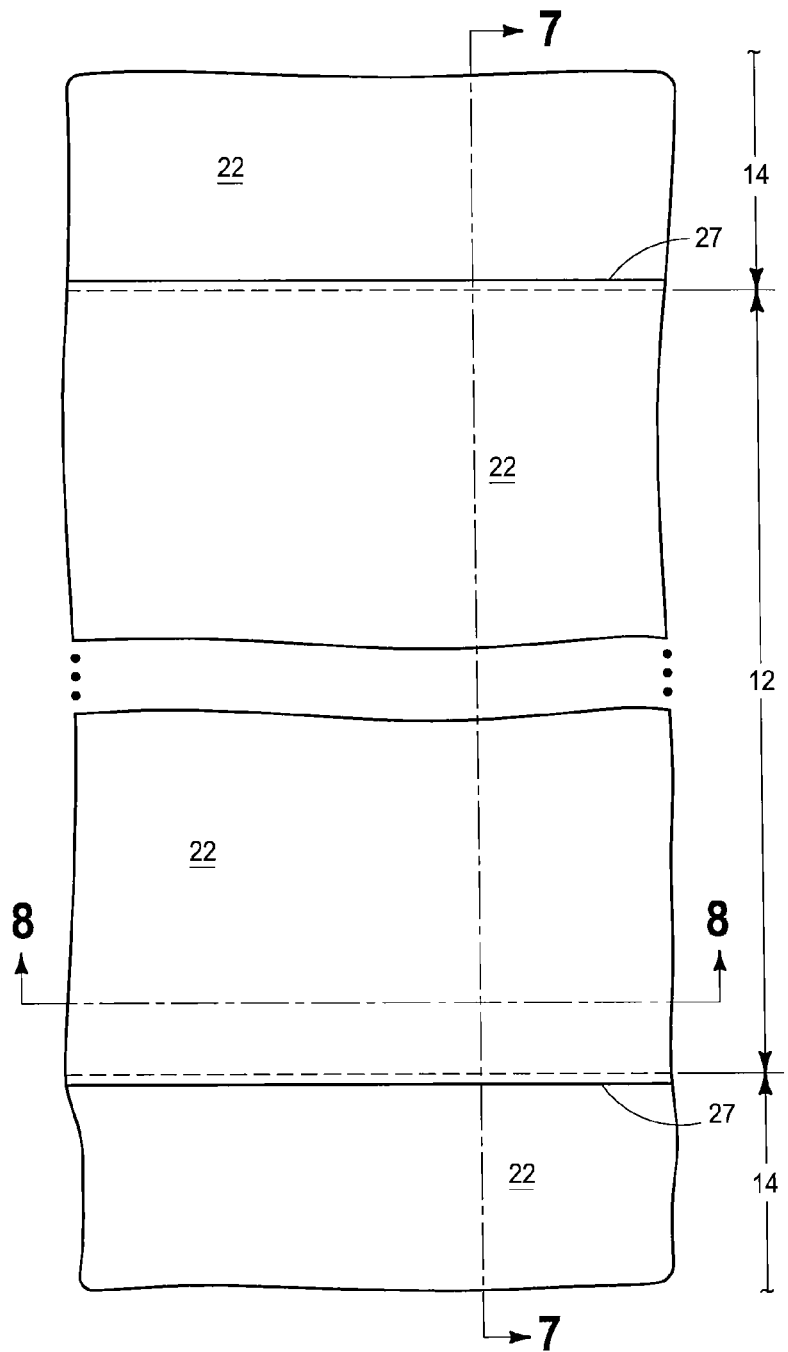
FIG. 6 is a diagrammatic top plan view of a substrate fragment in process in accordance with an embodiment of the invention.
Figure 7:
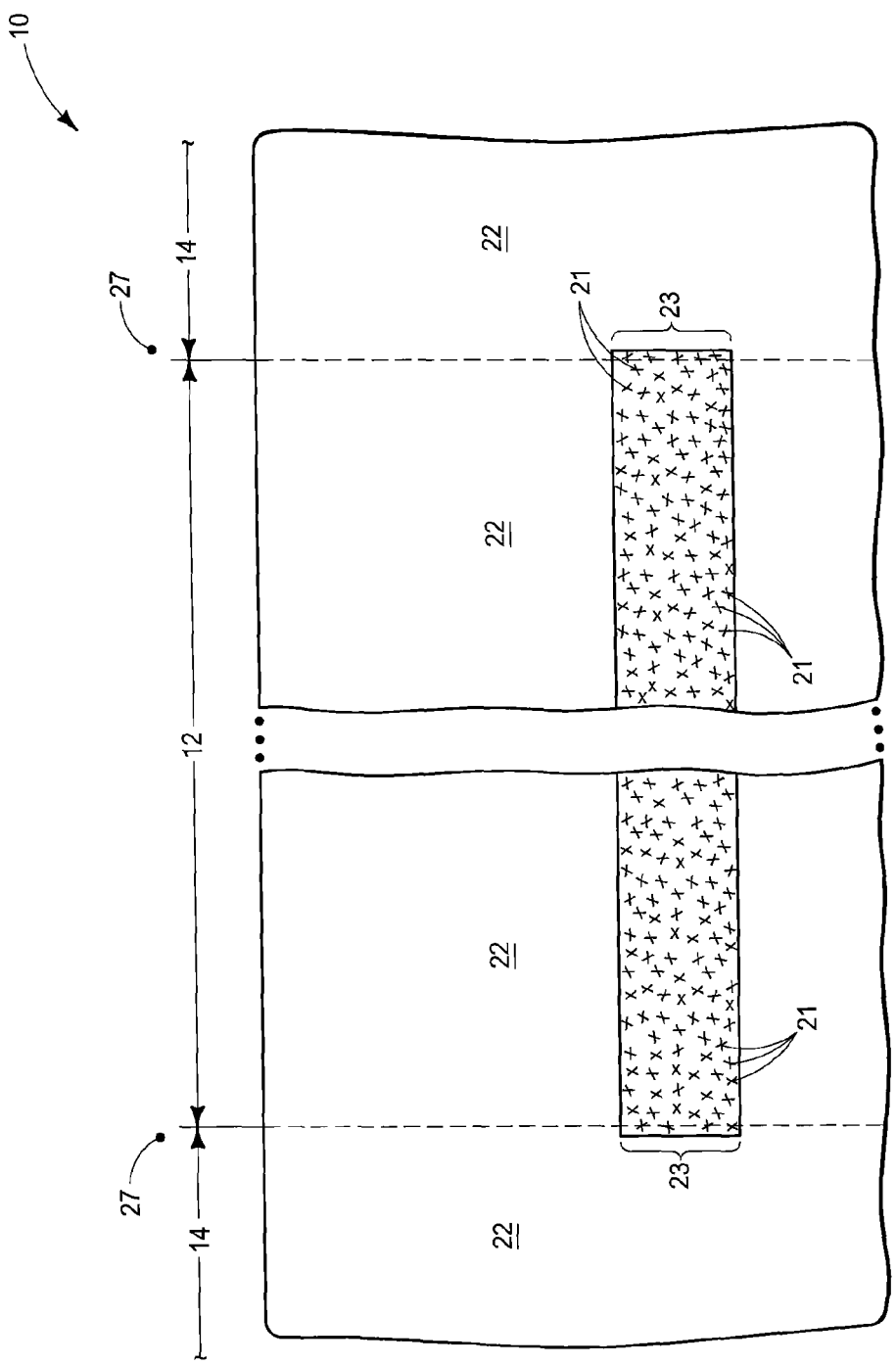
FIG. 7 is a cross-sectional view taken through line 7-7 in FIG. 6.
Figure 8:
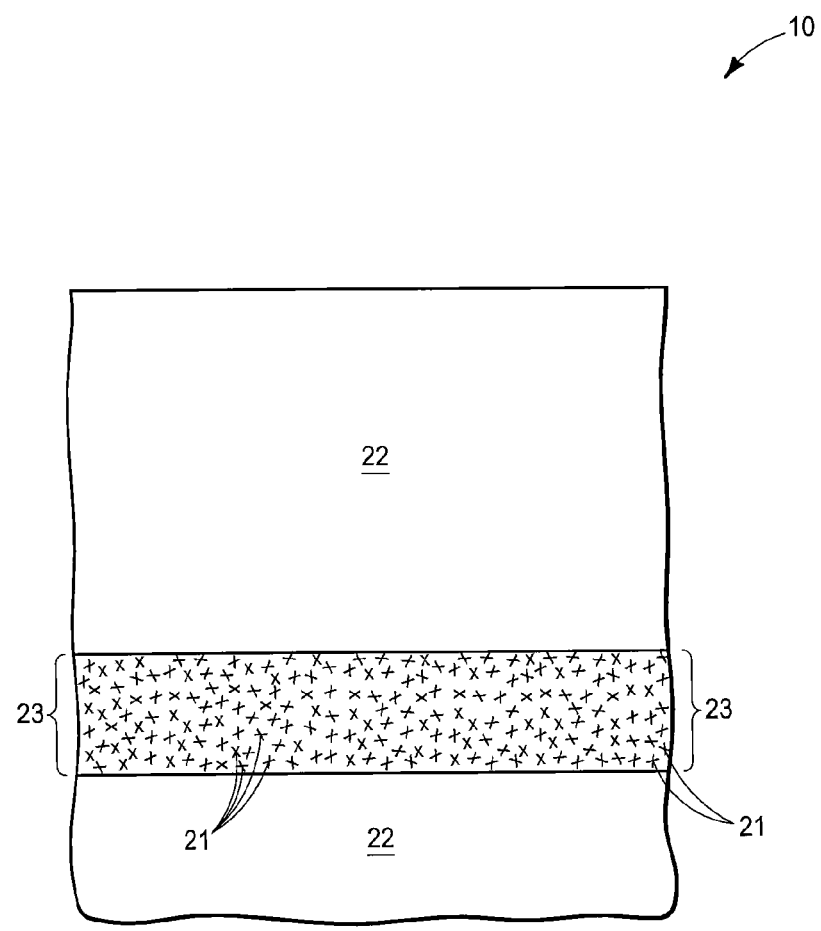
FIG. 8 is a cross-sectional view taken through line 8-8 in FIG. 6.

Example method embodiments of the invention are next described with reference to FIGS. 6-15, for example in fabricating the largely finished-construction circuitry of FIGS. 1-5. Accordingly, like numerals from FIGS. 1-5 for the same components or materials are also used in FIGS. 6-15. For example, FIGS. 6-8 show a predecessor substrate fragment 10 that includes silicon-comprising semiconductor material 22. Array 12 and peripheral regions 14 are shown, although such may not yet be distinguishable relative the other. Conductivity-neutral dopant 21 has been ion implanted into a region 23 of silicon-comprising semiconductor material 22. The conductivity-neutral dopant in the method embodiments is selected to provide enhanced diffusion of at least one of As and Sb in the silicon-comprising semiconductor material 22 than would otherwise occur under a set of heating conditions in the absence of the conductivity-neutral dopant under the set of heating conditions. Examples include carbon and germanium, with carbon being an ideal example. The conductivity-neutral dopant may be subjected to an annealing immediately after implanting. The artisan can select suitable implant energy and dose to achieve desired depth, elevational spread, and resultant concentration of the implant specie/species.

Region 23 may be considered as a buried volume of silicon-comprising semiconductor material. In one example embodiment, the conductivity-neutral dopant is ion implanted blanketly across a single continuous horizontal area of the silicon-comprising semiconductor material, for example the horizontal area that would be bounded between lines 27 (FIGS. 6 and 7). FIGS. 6-8 also show an example embodiment wherein the conductivity-neutral dopant has not largely been provided throughout peripheral region 14. Alternately, such may be so provided, for example in either patterned or blanket manners. Further, in one embodiment, the conductivity-neutral dopant is provided to be substantially horizontally homogenous where received in the silicon-comprising semiconductor material. An example thickness range for region 23 is from about 500 Angstroms to about 2,000 Angstroms. Example conductivity-neutral dopant concentrations are as described above with respect to dopant 21 in the example finished-circuitry construction of FIGS. 1-5.

Figure 9:
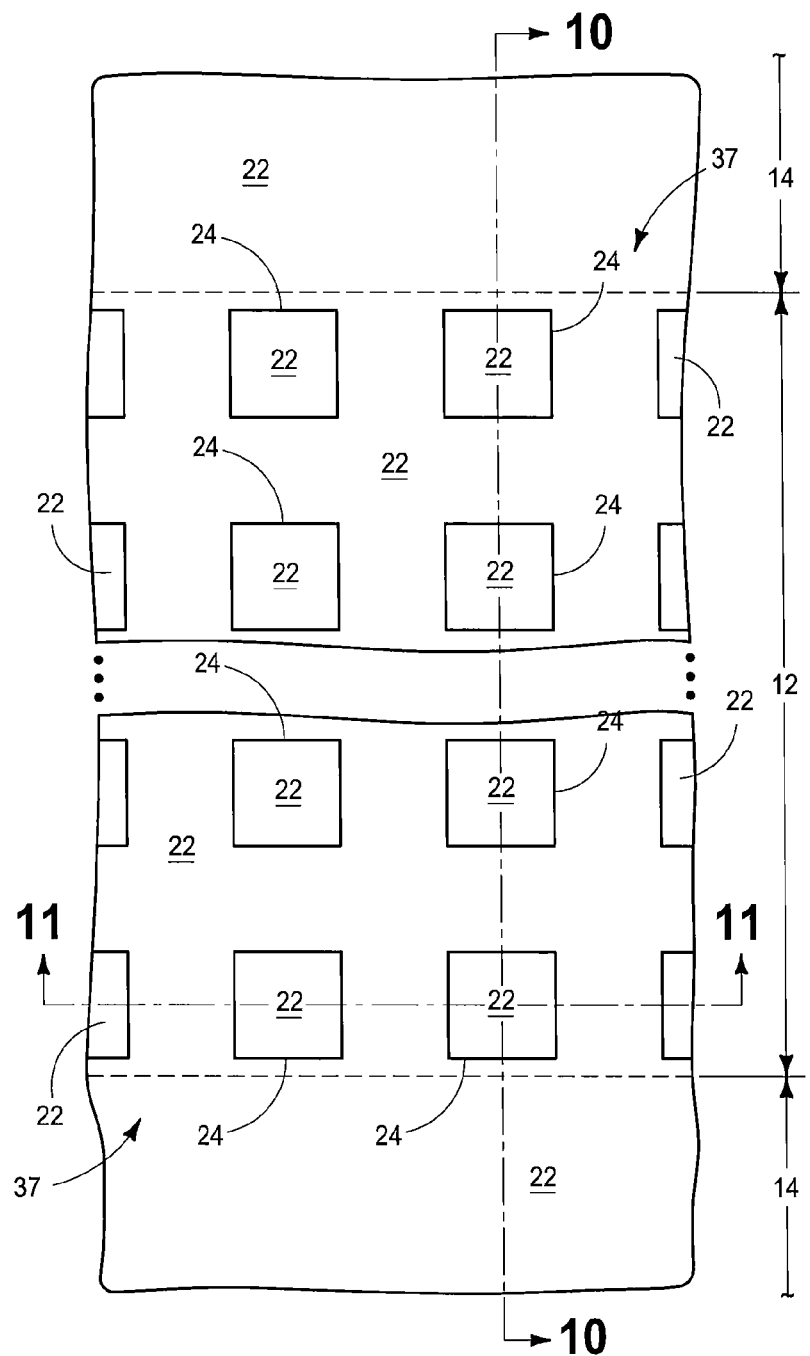
FIG. 9 is a view of the FIG. 6 substrate fragment at a processing step subsequent to that shown by FIG. 6.
Figure 10:
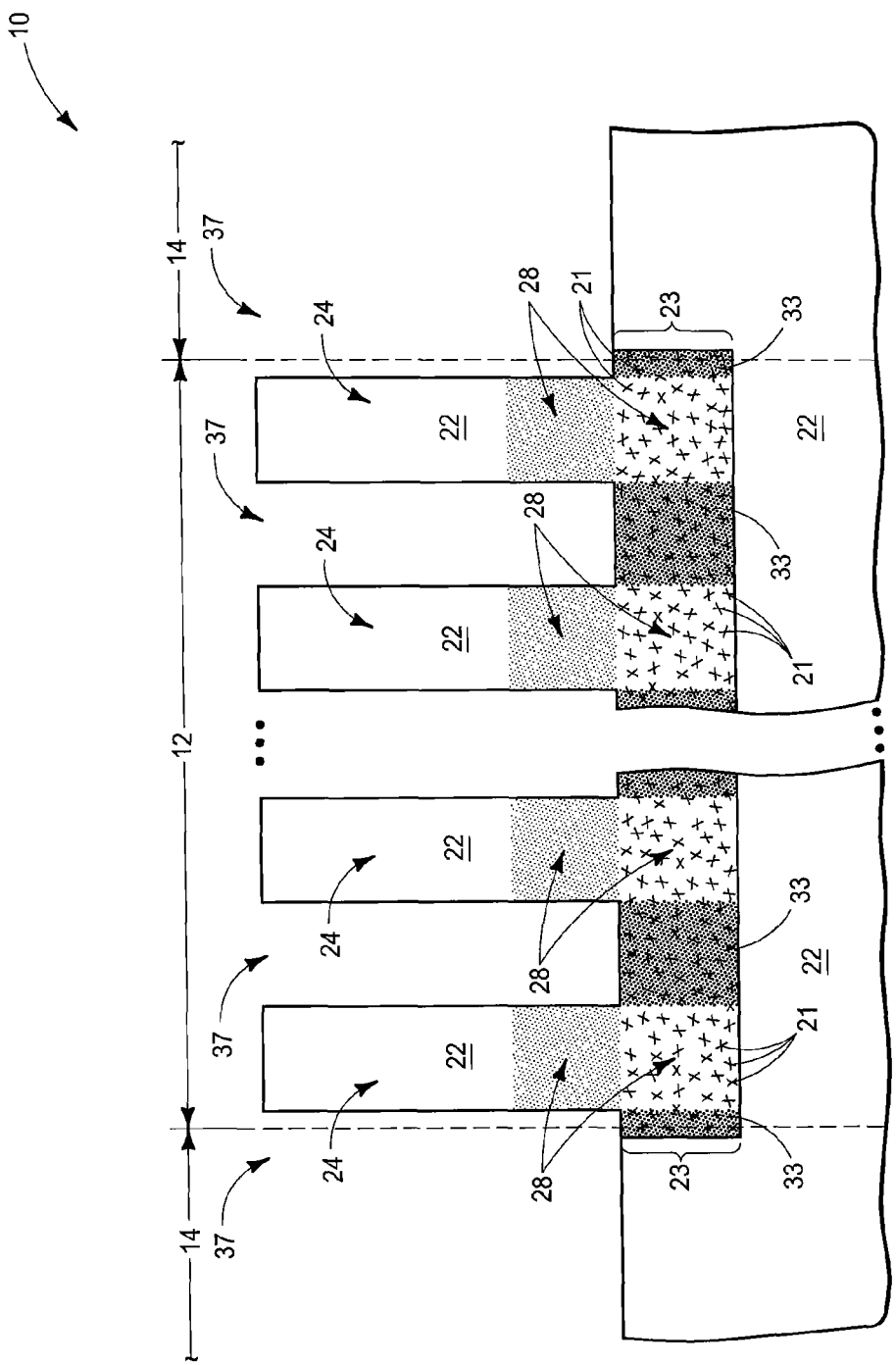
FIG. 10 is a cross-sectional view taken through line 10-10 in FIG. 9.
Figure 11:
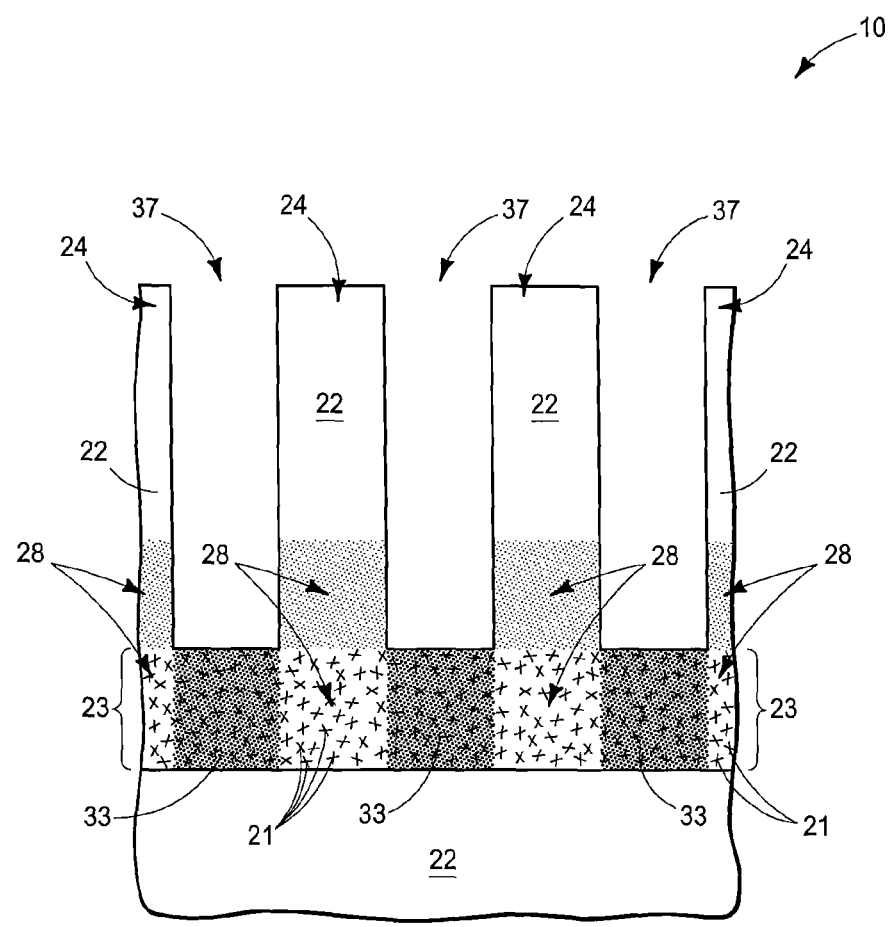
FIG. 11 is a cross-sectional view taken through line 11-11 in FIG. 9.

Referring to FIGS. 9-11, opening/openings 37 have been formed through silicon-comprising semiconductor material 22 to proximate buried volume/region 23. Locations 28 are indicated with lead-lines and arrowheads where inner source/drain regions 28 will ultimately be formed. An upper portion of individual locations 28 are shown as having been doped n-type, for example to constitute lightly-doped drain (LDD) regions. Where provided, an example technique is by ion implantation, and which may occur earlier or later in the process than shown by FIGS. 10 and 11. For example, such an LDD implant may be conducted into material 22 before or after etching to form some or all of opening/openings 37. Further, LDD regions may be formed in whole or in part by out-diffusion of As and/or Sb that has been provided in areas remote from the upper portions of locations 28, as will be described below.

FIGS. 9-11 show semiconductor-comprising pedestals 24 have been partially formed whereby openings 37 appear as a single continuous opening in FIG. 9. Alternately and only by way of example, only parallel trenches may be etched into material 22 at this point in the process. For example, parallel trenches (not shown) may be etched into silicon-comprising semiconductor material 22 between columns 38 in FIG. 1, thereby forming rails (not shown) of silicon-comprising semiconductor material 22 between such trenches. Further, those trenches may initially only be etched into material 22 to have bases that are proximate the uppermost portions of locations 28, and perhaps followed by an LDD and/or halo implant. Then, those trenches could be etched deeper to the depth shown in FIGS. 9 and 11. Alternately, such trenches could be initially etched to the depth shown regardless of when or if LDD and/or halo regions are ever formed. Subsequently, trenches orthogonal thereto, as an example, may be etched to form pedestals 24. However, pedestals 24 as shown in FIGS. 9-11 may not be formed at this point in the process. Accordingly and regardless, opening/openings 37 and/or trenches may be formed in one or more etching and/or masking steps. Conductivity-neutral dopant 21 may function as an etch-stop material for such etching.

Semiconductor-comprising pedestals 24 in FIGS. 9-11 are diagrammatically shown as having vertical, straight, and aligned sidewalls. However, such may not be so-provided and may for example include arcuate and/or angled portions regardless of any alignment. Further, silicon-comprising semiconductor material 22 of the pedestals or trenches may be lined with one or more dielectric materials during processing (not shown), and which may comprise a portion of dielectric 50 in the finished-circuitry construction.

Regardless, in one embodiment, FIGS. 10 and 11 show ion implanting having been conducted of at least one of As and Sb into buried volume/region 23 of silicon-comprising semiconductor material 22 laterally adjacent locations 28 where inner source/drain regions will ultimately be formed. The ion implanted As and Sb forms conductively-doped n-type regions 33 that are laterally spaced in at least one cross-section, for example either of the cross-sections depicted in FIGS. 10 and 11. If opening/openings 37 are formed in two separate orthogonal trench masking steps as described above, the conductively-doped n-type regions may solely extend in parallel lines at this point in the process, for example along lines between column lines 38 of FIG. 1 (not shown in FIGS. 10 and 11). Regardless, the As and/or Sb will ultimately diffuse into the laterally adjacent locations 28. The As and/or Sb is provided in regions 33 at a concentration that is sufficient to ultimately render such regions electrically conductive, and to render at least lowest-most portions of regions 28 electrically conductive after the As and/or Sb diffuses therein.

Figure 12:
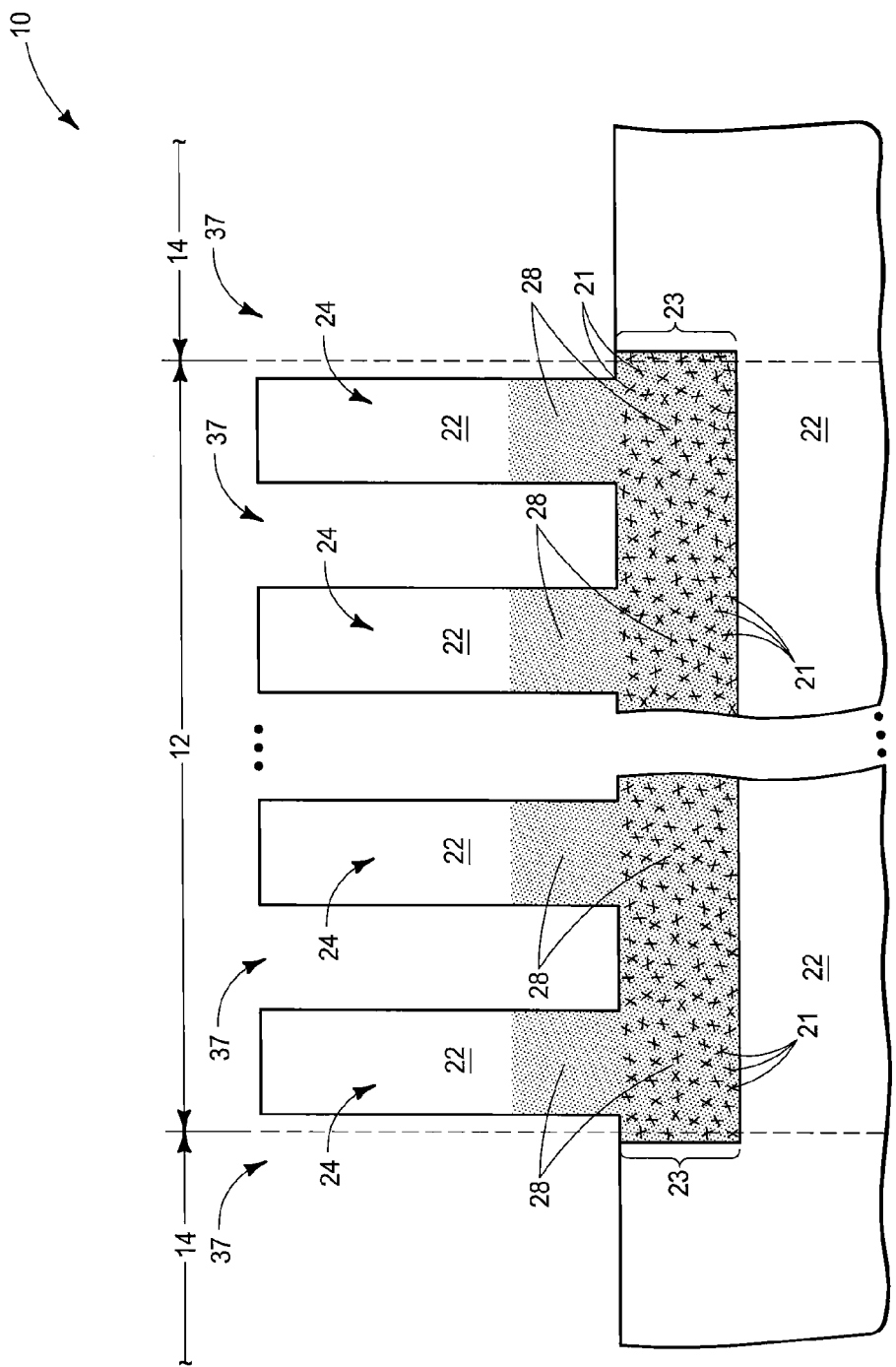
FIG. 12 is a view of the FIG. 10 substrate fragment at a processing step subsequent to that shown by FIG. 10, and corresponds in processing sequence to that of FIG. 13.
Figure 13:
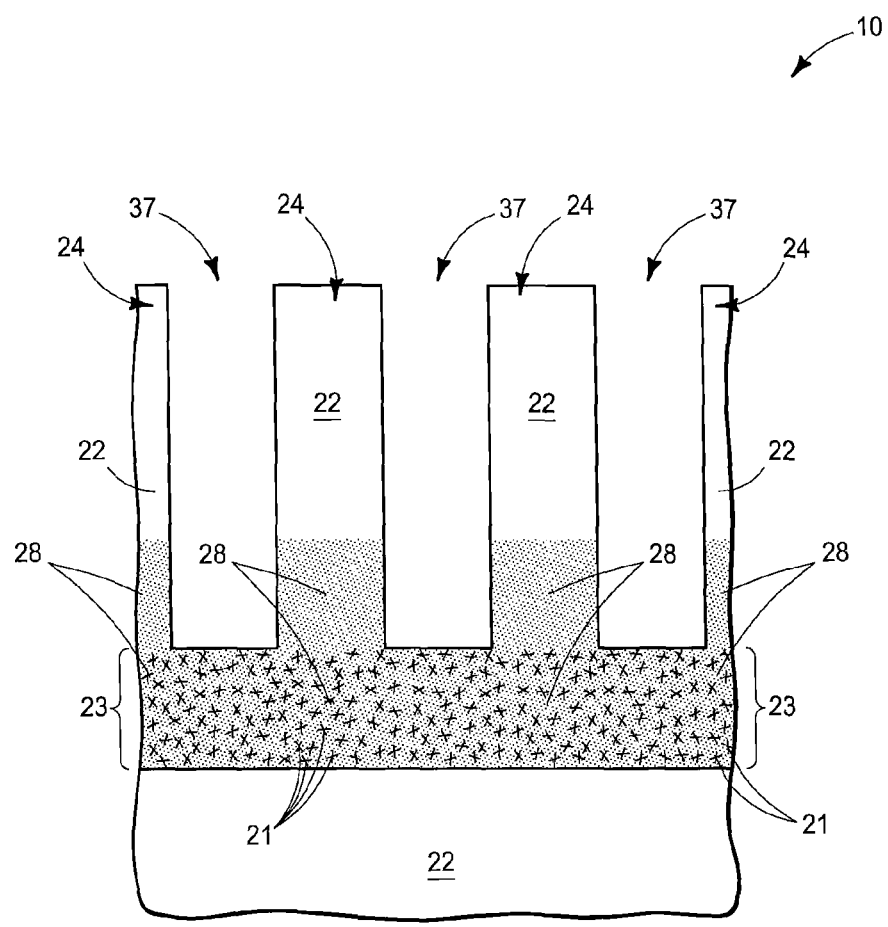
FIG. 13 is a view of the FIG. 11 substrate fragment at a processing step subsequent to that shown by FIG. 11, and corresponds in processing sequence to that of FIG. 12.

Referring to FIGS. 12 and 13, buried volume/region 23 of the silicon-comprising semiconductor material has been subjected to the set of heating conditions to cause the laterally-spaced conductively-doped n-type regions 33 (as shown in FIGS. 10 and 11, but not so designated in FIGS. 12 and 13) to interconnect in cross-section, for example in the cross-section shown by FIG. 12 and also in the cross-section shown by FIG. 13. This would also occur if the conductively-doped n-type regions solely extend in parallel lines (not shown) in the event pedestals 24 have not been formed yet. Regardless, example conditions include subjecting the substrate to 900° C. for about 30 minutes in an inert atmosphere. The interconnected regions may be electrically conductive immediately upon interconnecting or become so upon an activation anneal. In one embodiment, the set of conditions is sufficient to act as a dopant activation anneal for activating the As and/or Sb dopant. In one embodiment, the set of conditions may be used to diffuse As and/or Sb dopant in forming LDD regions proximate channel regions 26 as part of inner source/drain regions 28 where such are not provided separately by ion implantation or other manner. Regardless, conductivity-neutral dopant 21 provides enhanced diffusion of at least one of As and Sb in the silicon-comprising semiconductor material 22 under the set of heating conditions than would otherwise occur in the absence of the conductivity-neutral dopant. Presence of conductivity-neutral dopant 21 may provide more uniform diffusion and/or greater diffusion of the As and/or Sb which improves conductivity of data/sense lines 44 (i.e., reduces internal resistance in lines 44). Additionally, presence of the conductivity-neutral dopant may facilitate depth and height definition (i.e., vertical extent) of lines 44. For example, such may restrict to at least some degree vertical diffusion beyond the depth and/or height of a region in which the conductivity-neutral dopant is received due to reduced diffusion occurring above and/or below such region. Thereby, resultant data/sense line-to-data/sense line leakage and/or cross-talk might be reduced.

Figure 14:
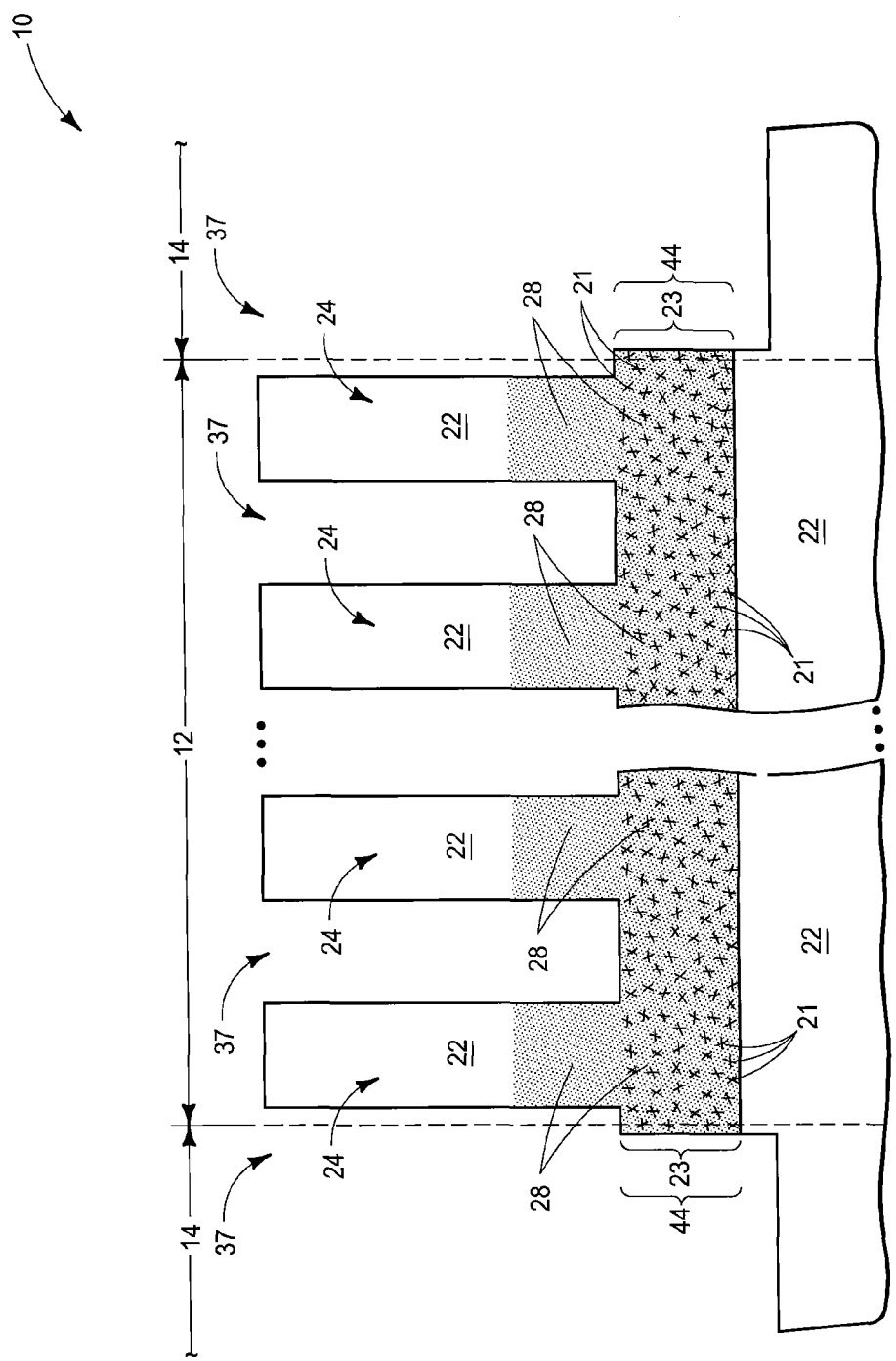
FIG. 14 is a view of the FIG. 12 substrate fragment at a processing step subsequent to that shown by FIG. 12, and corresponds in processing sequence to that of FIG. 15.
Figure 15:
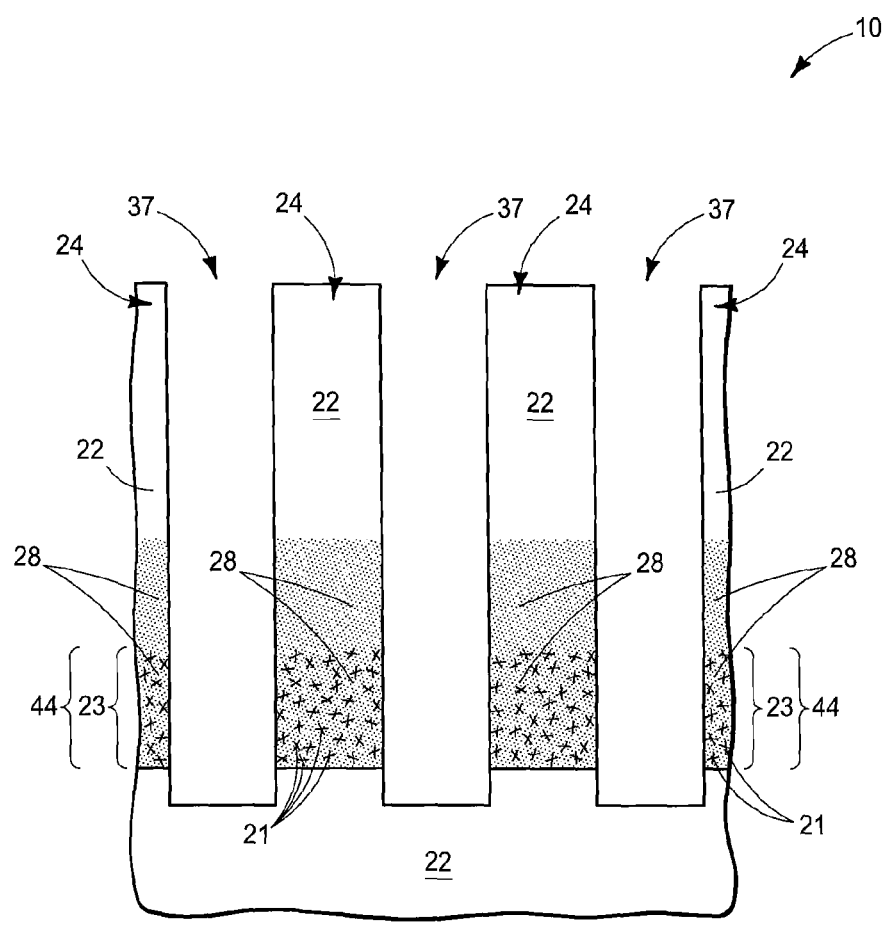
FIG. 15 is a view of the FIG. 13 substrate fragment at a processing step subsequent to that shown by FIG. 13, and corresponds in processing sequence to that of FIG. 14.

Individual conductive lines are ultimately formed from the laterally interconnected conductively-doped n-type regions and which comprise multiple of the elevationally inner source/drain regions in the finished circuitry construction. In one embodiment, such includes etching into the buried volume after laterally interconnecting the laterally-spaced conductively-doped n-type regions, and in one embodiment etching through the buried n-type conductively-doped volume. FIGS. 14 and 15 show an embodiment wherein elevationally inner source/drain regions 28 and data/sense lines 44 have been formed by etching through region 23. As an alternate example, silicon-comprising material 22 may be etched first to form the lines (not shown) and then the substrate subjected to the set of heating conditions to interconnect n-type regions 33 (as shown in FIGS. 10 and 11, but not so designated in FIGS. 12-15). Regardless, if pedestals 24 have not yet been circumferentially formed, they may be so formed by etching orthogonally oriented parallel trenches after the example FIGS. 14 and 15 etching has been conducted.

Subsequent processing may occur in forming a structure as shown and described relative to FIGS. 1-5, or otherwise, and is not germane to invention herein.

Conductivity-neutral dopant may be provided within the silicon-comprising semiconductor material using techniques other than ion implantation in the above and other embodiments. Further and regardless, the FIGS. 6-15 processing shows formation of conductivity-neutral dopant within the silicon-comprising semiconductor material before the laterally-spaced conductively-doped n-type regions are formed in the silicon-comprising semiconductor material. This relationship may be reversed whereby the laterally-spaced conductively-doped n-type regions are formed in the silicon-comprising semiconductor material before the conductivity-neutral dopant is provided in the silicon-comprising semiconductor material.

Figure 16:
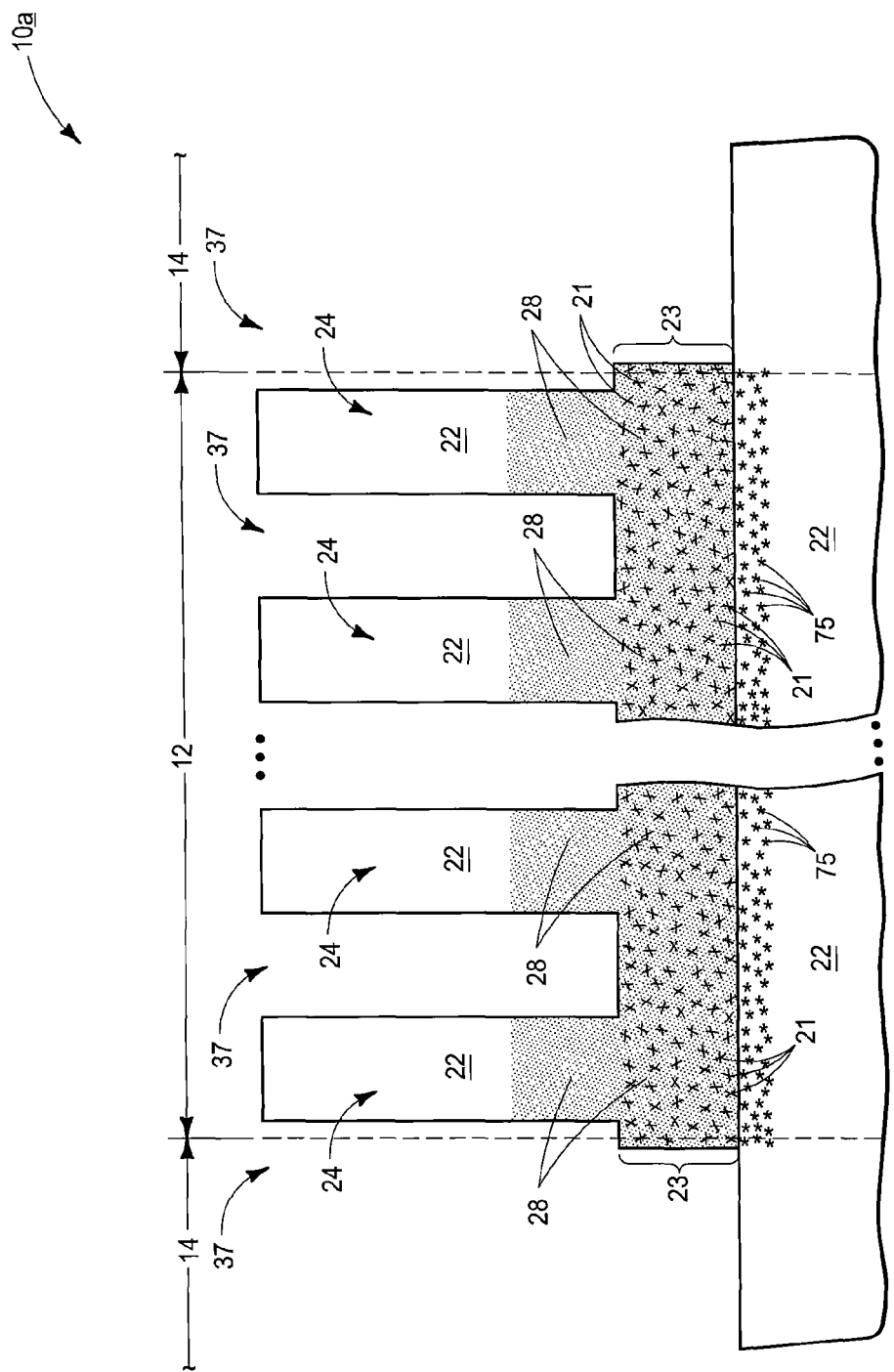
FIG. 16 is a view of an alternate embodiment substrate fragment, and corresponds in position to the cross-section of the FIG. 14 substrate fragment.
Figure 17:
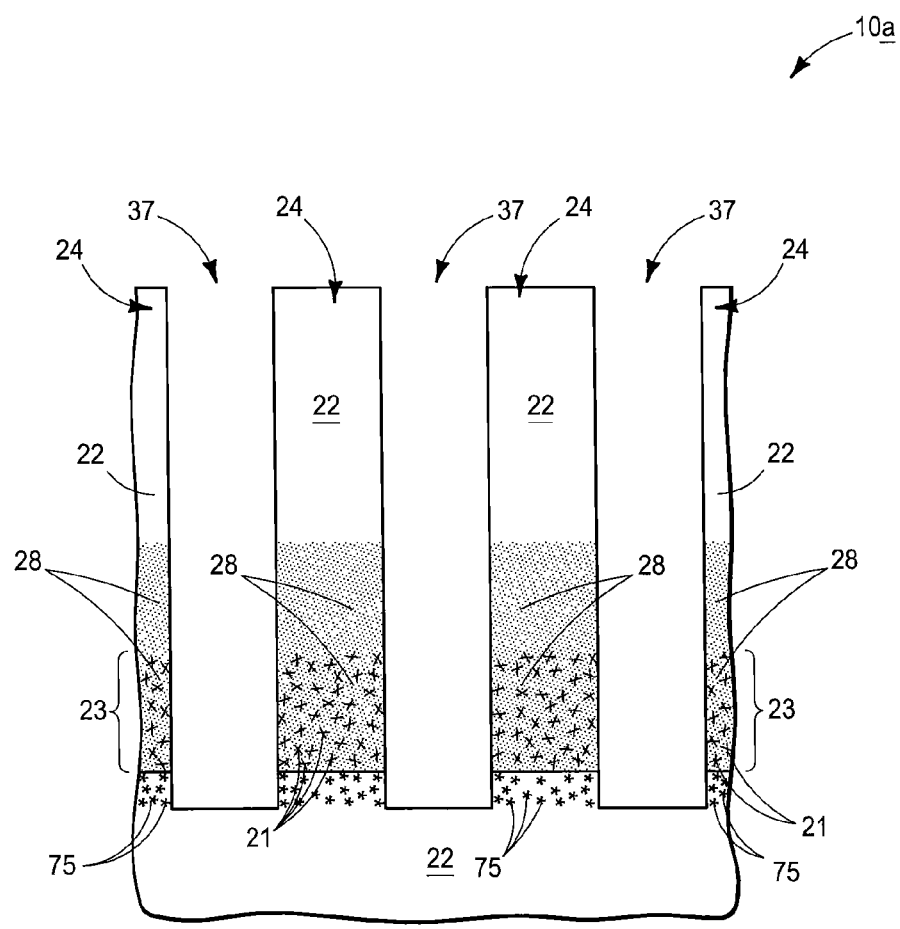
FIG. 17 is a view of the FIG. 16 substrate fragment, and corresponds in position to the cross-section of the FIG. 15 substrate fragment.

An additional example embodiment is described with reference to FIGS. 16 and 17 with respect to a substrate fragment 10*a*. Like numerals from the above-described embodiments have been used where appropriate, with some construction differences being indicated with the suffix "a" or with different numerals. FIGS. 16 and 17 show example additional processing having been conducted with respect to the FIGS. 14 and 15 substrate either prior to or thereafter, but regardless prior to subjecting the buried volume/region of silicon-comprising semiconductor material to the set of heating conditions as shown by FIGS. 12 and 13. Specifically, a conductivity-neutral dopant 75 has been provided into silicon-comprising semiconductor material 22 that would be immediately elevationally inward of spaced conductively-doped n-type regions 33 in the FIGS. 10 and 11 construction. In method embodiments, conductivity-neutral dopant 75 is selected to restrict diffusion of the As and/or Sb into such underlying material 22 than would otherwise occur under the set of heating conditions in the absence of conductivity-neutral dopant 75. Example conductivity-neutral dopants 75 include N, O, and/or S, with N being ideal. In structure embodiments, conductivity-neutral dopant 75 constitutes another different conductivity-neutral dopant in silicon-comprising semiconductor material that is immediately elevationally inward of the data/sense lines independent of any diffusion-restricting attribute. Regardless, in one embodiment, conductivity-neutral dopant 75 is at a concentration of from about $1\times10^{19}$ atoms/cm$^3$ to about $1\times10^{22}$ atoms/cm$^3$ where received in the silicon-comprising semiconductor material.

Embodiments of the invention include a method of forming a plurality of conductive lines that are buried in silicon-comprising semiconductor material independent of whether fabricated in connection with formation of vertically-oriented transistors, and even if so independent of the above described structures. Such a method includes providing n-type dopant into a buried volume of silicon-comprising semiconductor material at a concentration sufficient to ultimately render silicon-comprising semiconductor material within which the dopant is received electrically conductive. The buried volume comprises conductively-doped n-type regions that are laterally spaced in at least one cross-section. The n-type dopant in such laterally-spaced n-type regions is at least one of As and Sb. Laterally-spaced regions 33 in the above-described embodiments are but one example.

A conductivity-neutral dopant is provided in the buried volume of silicon-comprising semiconductor material. That conductivity-neutral dopant provides enhanced diffusion of the As and Sb in the silicon-comprising semiconductor material than would otherwise occur under a set of heating conditions in the absence of the conductivity-neutral dopant under the set of heating conditions. The buried volume of silicon-comprising semiconductor material is subjected to the set of heating conditions to cause the laterally-spaced n-type regions to interconnect. Individual conductive lines are ultimately formed of the plurality of conductive lines from the laterally interconnected conductively-doped n-type regions. Lines of the silicon-comprising material might formed before or after exposure to the set of heating conditions.

One or both of providing the n-type and conductivity-neutral dopants may occur by ion implantation or other technique, and/or otherwise as described above. Further, either may be provided within the buried volume of silicon-comprising semiconductor material before or after the other. In one embodiment, the buried volume of silicon-comprising semiconductor material in which the laterally-spaced conductively-doped n-type regions are formed is p-type. In one embodiment, the individual conductive lines are horizontally oriented. Any other attribute as described above may be used in such methods of forming a plurality of conductive lines that are buried in silicon-comprising semiconductor material.

Embodiments of the invention also include integrated circuitry which comprises a conductive line buried in silicon-comprising semiconductor material. That conductive line is conductively-doped n-type with at least one of As and Sb. The conductively-doped semiconductor material of the conductive line comprises a conductivity-neutral dopant. Any other attributes as described above with respect to lines 44 in FIGS. 1-5 may be used.

CONCLUSION

In some embodiments, a method of forming a plurality of conductive lines buried in silicon-comprising semiconductor material includes providing n-type dopant into a buried volume of silicon-comprising semiconductor material at a concentration sufficient to ultimately render silicon-comprising semiconductor material within which the dopant is received electrically conductive. The buried n-type conductively-doped volume comprises conductively-doped n-type regions that are laterally spaced in at least one cross-section. N-type dopant in the laterally-spaced n-type regions is at least one of As and Sb. A conductivity-neutral dopant is provided in the buried volume of silicon-comprising semiconductor material. The conductivity-neutral dopant provides enhanced diffusion of the at least one of As and Sb in the silicon-comprising semiconductor material than would otherwise occur under a set of heating conditions in the absence of the conductivity-neutral dopant under the set of heating conditions. The buried volume of silicon-comprising semiconductor material is subjected to the set of heating conditions to cause the laterally-spaced n-type regions to interconnect. Individual conductive lines of the plurality of conductive lines are formed from the laterally interconnected conductively-doped n-type regions.

In some embodiments, a method forms an array comprising vertically-oriented transistors. The transistors individually comprise an elevationally outer source/drain region, an elevationally inner source/drain region comprising silicon-comprising semiconductor material that is conductively-doped n-type with at least one of As and Sb, and a channel region elevationally between the inner and outer source/drain regions. The method comprises ion implanting a conductivity-neutral dopant into a buried region of silicon-comprising semiconductor material. The conductivity-neutral dopant provides enhanced diffusion of the at least one of As and Sb in the silicon-comprising semiconductor material than would otherwise occur under a set of heating conditions in the absence of the conductivity-neutral dopant under the set of heating conditions. At least one of As and Sb is ion implanted into the buried region of silicon-comprising semiconductor material laterally adjacent locations of the inner/source drain regions. The ion implanted at least one of As and Sb forms conductively-doped n-type regions that are laterally spaced in at least one cross-section. The buried region of silicon-comprising semiconductor material is subjected to the set of heating conditions to cause the laterally-spaced conductively-doped n-type regions to interconnect in the at least one cross-section. Individual conductive lines are formed from the laterally interconnected conductively-doped n-type regions and which comprise multiple of the elevationally inner source/drain regions.

In some embodiments, an array comprises vertically-oriented transistors, rows of access lines, and columns of data/sense lines. Individual of the rows comprise an access line interconnecting transistors in that row. Individual of the columns comprise a data/sense line interconnecting transistors in that column. The data/sense line comprises silicon-comprising semiconductor material between the transistors in that column that is conductively-doped n-type with at least one of As and Sb. The conductively-doped semiconductor material of the data/sense line comprises a conductivity-neutral dopant between the transistors in that column.

In some embodiments, integrated circuitry comprises a conductive line buried in silicon-comprising semiconductor material. The conductive line comprises the silicon-comprising semiconductor material that is conductively-doped n-type with at least one of As and Sb. The conductively-doped semiconductor material of the conductive line comprises a conductivity-neutral dopant.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. A method of forming a plurality of conductive lines buried in silicon-comprising semiconductor material, comprising:
providing n-type dopant into a buried volume of silicon-comprising semiconductor material at a concentration sufficient to ultimately render silicon-comprising semiconductor material within which the dopant is received electrically conductive, the buried n-type conductively-doped volume comprising conductively-doped n-type regions that are laterally spaced in at least one cross-section, n-type dopant in the laterally-spaced n-type regions being at least one of As and Sb;
providing a conductivity-neutral dopant in the buried volume of silicon-comprising semiconductor material, the conductivity-neutral dopant providing greater diffusion of the at least one of As and Sb in the silicon-comprising semiconductor material than would otherwise occur under a set of heating conditions in the absence of the conductivity-neutral dopant under the set of heating conditions; and
subjecting the buried volume of silicon-comprising semiconductor material to the set of heating conditions to cause the laterally-spaced n-type regions to interconnect and forming individual conductive lines of the plurality of conductive lines from the laterally interconnected conductively-doped n-type regions.

2. The method of claim 1 wherein the buried volume of silicon-comprising semiconductor material in which the laterally-spaced conductively-doped n-type regions are formed is p-type.

3. The method of claim 1 wherein the n-type dopant is As.

4. The method of claim 1 wherein the n-type dopant is Sb.

5. The method of claim 1 wherein the n-type dopant is As and Sb.

6. The method of claim 1 wherein the individual conductive lines are horizontally-oriented a have a thickness of from about 500 Angstroms to about 2,000 Angstroms.

7. The method of claim 1 wherein the conductivity-neutral dopant is provided to be substantially horizontally homogenous where received in the silicon-comprising semiconductor material.

8. The method of claim 1 wherein the conductivity-neutral dopant is provided at a concentration of from about $1 \times 10^{19}$ atoms/cm$^3$ to about $1 \times 10^{22}$ atoms/cm$^3$ where received in the silicon-comprising semiconductor material.

9. The method of claim 1 wherein the conductivity-neutral dopant is carbon.

10. The method of claim 1 wherein the conductivity-neutral dopant is germanium.

11. The method of claim 1 wherein the conductivity-neutral dopant is provided by ion implantation.

12. The method of claim 11 wherein the conductivity-neutral dopant is ion implanted blanketly across a single continuous horizontal area of the silicon-comprising semiconductor material.

13. The method of claim 1 wherein the conductivity-neutral dopant is provided in the silicon-comprising semiconductor material before the laterally-spaced conductively-doped n-type regions are formed in the silicon-comprising semiconductor material.

14. The method of claim 1 wherein the laterally-spaced conductively-doped n-type regions are formed in the silicon-comprising semiconductor material before the conductivity-neutral dopant is provided in the silicon-comprising semiconductor material.

15. The method of claim 1 wherein the forming the individual conductive lines of the plurality of conductive lines from the interconnected conductively-doped n-type regions comprises etching into the buried volume after laterally interconnecting the laterally-spaced conductively-doped n-type regions to thereby define longitudinal outlines of the individual lines.

16. The method of claim 15 wherein the etching is through the buried volume.

17. The method of claim 1 wherein the set of heating conditions activates the n-type dopant.

18. The method of claim 1 wherein the conductivity-neutral dopant restricts to at least some degree vertical diffusion beyond the depth and/or height of a region of the silicon-comprising semiconductor material within which the conductivity-neutral dopant is received.

19. The method of claim 1 comprising prior to subjecting the buried volume of the silicon-comprising semiconductor material to the set of heating conditions:
providing a conductivity-neutral dopant into silicon-comprising semiconductor material that is immediately elevationally inward of the spaced conductively-doped n-type regions, the conductivity-neutral dopant in said immediately elevationally inward silicon-comprising semiconductor material restricting diffusion of the at least one of As and Sb into said immediately elevationally inward silicon-comprising semiconductor material than would otherwise occur under the set of heating conditions in the absence of the conductivity-neutral dopant in said immediately elevationally inward silicon-comprising semiconductor material.

20. The method of claim 19 wherein the conductivity-neutral dopant in said immediately elevationally inward silicon-comprising semiconductor material comprises at least one of N, O, and S.

21. The method of claim 15 wherein the conductivity-neutral dopant is provided at a concentration of from about $1\times10^{19}$ atoms/cm$^3$ to about $1\times10^{22}$ atoms/cm$^3$ where received in the silicon-comprising semiconductor material.

22. The method of claim 15 wherein the conductivity-neutral dopant is carbon.

23. The method of claim 15 wherein the conductivity-neutral dopant is germanium.

24. The method of claim 15 wherein the set of heating conditions activates the n-type dopant.

25. The method of claim 15 wherein the conductivity-neutral dopant restricts to at least some degree vertical diffusion beyond the depth and/or height of a region of the silicon-comprising semiconductor material within which the conductivity-neutral dopant is received.

26. A method of forming an array comprising vertically-oriented transistors; the transistors individually comprising an elevationally outer source/drain region, an elevationally inner source/drain region comprising silicon-comprising semiconductor material that is conductively-doped n-type with at least one of As and Sb, and a channel region elevationally between the inner and outer source/drain regions; the method comprising:
ion implanting a conductivity-neutral dopant into a buried region of silicon-comprising semiconductor material, the conductivity-neutral dopant providing greater diffusion of the at least one of As and Sb in the silicon-comprising semiconductor material than would otherwise occur under a set of heating conditions in the absence of the conductivity-neutral dopant under the set of heating conditions;
ion implanting at least one of As and Sb into the buried region of silicon-comprising semiconductor material laterally adjacent locations of the inner/source drain regions, the ion implanted at least one of As and Sb forming conductively-doped n-type regions that are laterally spaced in at least one cross-section; and
subjecting the buried region of silicon-comprising semiconductor material to the set of heating conditions to cause the laterally-spaced conductively-doped n-type regions to interconnect in the at least one cross-section and forming individual conductive lines from the laterally interconnected conductively-doped n-type regions and which comprise multiple of the elevationally inner source/drain regions.

27. The method of claim 26 comprising forming the vertically-oriented transistors to individually comprise part of a memory cell.

28. The method of claim 27 comprising forming a charge storage device that is electrically coupled to the elevationally outer source/drain region as part of the memory cell.

29. The method of claim 27 comprising:
forming gates of the vertically-oriented transistors to comprise rows of access lines, individual of the rows comprising an access line interconnecting transistors in that row; and
forming columns of data/sense lines, individual of the columns comprising a data/sense line interconnecting transistors in that column, the data/sense lines individually comprising an individual of the conductive lines.

30. The method of claim 26 wherein the conductivity-neutral dopant is provided at a concentration of from about $1\times10^{19}$ atoms/cm$^3$ to about $1\times10^{22}$ atoms/cm$^3$ where received in the silicon-comprising semiconductor material.

* * * * *

UNITED STATES PATENT AND TRADEMARK OFFICE
CERTIFICATE OF CORRECTION

| | | |
|---|---|---|
| PATENT NO. | : 9,129,896 B2 | Page 1 of 1 |
| APPLICATION NO. | : 13/591065 | |
| DATED | : September 8, 2015 | |
| INVENTOR(S) | : Hu et al. | |

It is certified that error appears in the above-identified patent and that said Letters Patent is hereby corrected as shown below:

In the claims

Col. 12, line 27, claim 6, delete "a have" after "horizontally-oriented" and insert --and have.--.

Signed and Sealed this
Ninth Day of February, 2016

Michelle K. Lee
*Director of the United States Patent and Trademark Office*